US010668497B2

(12) United States Patent
Akizuki

(10) Patent No.: US 10,668,497 B2
(45) Date of Patent: Jun. 2, 2020

(54) SUBSTRATE PROCESSING METHOD AND SUBSTRATE PROCESSING DEVICE

(71) Applicant: SCREEN Holdings Co., Ltd., Kyoto (JP)

(72) Inventor: Yusuke Akizuki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/559,076

(22) PCT Filed: Feb. 25, 2016

(86) PCT No.: PCT/JP2016/055646
§ 371 (c)(1),
(2) Date: Sep. 18, 2017

(87) PCT Pub. No.: WO2016/152371
PCT Pub. Date: Sep. 29, 2016

(65) Prior Publication Data
US 2018/0071772 A1     Mar. 15, 2018

(30) Foreign Application Priority Data

Mar. 24, 2015   (JP) .................. 2015-061287
Dec. 17, 2015   (JP) .................. 2015-246629

(51) Int. Cl.
*B05C 11/10*     (2006.01)
*G03F 7/42*      (2006.01)
(Continued)

(52) U.S. Cl.
CPC .......... *B05C 11/1039* (2013.01); *B05C 11/08* (2013.01); *B05C 11/1042* (2013.01);
(Continued)

(58) Field of Classification Search
CPC . B05C 11/1039; B05C 11/1042; B05C 11/08; G03F 1/00; H01L 21/027; B05D 7/24; C09K 13/08
See application file for complete search history.

(56) References Cited

U.S. PATENT DOCUMENTS 4,100,014 A * 7/1978 Kuhn-Kuhnenfeld ....................... H01L 21/30612
252/79.3
5,294,570 A * 3/1994 Fleming, Jr. ...... H01L 21/02052
134/28

(Continued)

FOREIGN PATENT DOCUMENTS

| CN | 1920673 A | 2/2007 |
| CN | 101937842 A | 1/2011 |

(Continued)

OTHER PUBLICATIONS

International Search Report dated May 10, 2016 in corresponding PCT International Application No. PCT/JP2016/055646.
(Continued)

*Primary Examiner* — Anita K Alanko
(74) *Attorney, Agent, or Firm* — Ostrolenk Faber LLP

(57) ABSTRACT

In order to solve the problem of satisfactorily removing a resist from the surface of a substrate, the present invention is a substrate processing device (1) having a spin chuck (5) and an SPM feed unit (6) for feeding SPM to the substrate (W) held by the spin chuck (5), wherein the SPM feed unit (6) includes a mixing unit (30) for mixing an aqueous hydrogen peroxide solution and hydrofluoric acid and producing a liquid mixture of hydrogen peroxide water and hydrofluoric acid, and an HF-mixed SPM production unit (14) for mixing the liquid mixture and sulfuric acid and producing HF-mixed SPM.

10 Claims, 6 Drawing Sheets

(51) Int. Cl.
   *H01L 21/67* (2006.01)
   *H01L 21/311* (2006.01)
   *B05C 11/08* (2006.01)
   *B05D 7/24* (2006.01)
   *H01L 21/027* (2006.01)
   *C09K 13/08* (2006.01)

(52) U.S. Cl.
   CPC ............... *B05D 7/24* (2013.01); *G03F 7/423* (2013.01); *G03F 7/425* (2013.01); *H01L 21/027* (2013.01); *H01L 21/31133* (2013.01); *H01L 21/67* (2013.01); *C09K 13/08* (2013.01)

(56) References Cited

U.S. PATENT DOCUMENTS

| | | | | |
|---|---|---|---|---|
| 5,634,980 | A * | 6/1997 | Tomita | B08B 3/08 134/18 |
| 6,605,230 | B1 * | 8/2003 | Liaw | G03F 7/423 134/1.3 |
| 7,300,598 | B2 * | 11/2007 | Konishi | B08B 3/024 134/32 |
| 7,718,009 | B2 * | 5/2010 | Verhaverbeke | B08B 3/08 134/2 |
| 9,412,628 | B2 * | 8/2016 | DeKraker | H01L 21/02052 |
| 9,748,111 | B2 * | 8/2017 | Ye | H01L 21/3212 |
| 2002/0104555 | A1 | 8/2002 | Sugano | 134/30 |
| 2002/0148485 | A1 | 10/2002 | Taft et al. | 134/18 |
| 2003/0209514 | A1 * | 11/2003 | Ramachandran | C09D 9/00 216/2 |
| 2004/0000322 | A1 * | 1/2004 | Verhaverbeke | B08B 3/12 134/1.3 |
| 2004/0163681 | A1 * | 8/2004 | Verhaverbeke | C11D 3/042 134/28 |
| 2005/0173066 | A1 | 8/2005 | Sugano | 156/345.29 |
| 2007/0045231 | A1 | 3/2007 | Wada | 216/83 |
| 2010/0326476 | A1 | 12/2010 | Rho et al. | 134/26 |
| 2011/0073489 | A1 | 3/2011 | Hayamizu et al. | 205/766 |
| 2013/0223180 | A1 * | 8/2013 | Komiya | H01L 21/6715 366/132 |
| 2014/0326281 | A1 | 11/2014 | Nakamura | 134/95.1 |
| 2015/0072078 | A1 | 3/2015 | Negoro et al. | 427/346 |

FOREIGN PATENT DOCUMENTS

| | | |
|---|---|---|
| JP | S60-173840 A | 9/1985 |
| JP | H06-291098 A | 10/1994 |
| JP | 08-250400 A | 9/1996 |
| JP | 2002-313771 A | 10/2002 |
| JP | 2002-343762 A | 11/2002 |
| JP | 2008-004878 A | 1/2008 |
| JP | 2011-068937 A | 4/2011 |
| JP | 2013-175592 A | 9/2013 |

OTHER PUBLICATIONS

Written Opinion dated May 10, 2016 in corresponding PCT International Application No. PCT/JP2016/055646.
International Preliminary Report on Patentability (Chapter I) with a Notification from the International Bureau Form PCT/IB/326 for International Application No. PCT/JP2016/055646 dated Oct. 5, 2017.
English translation of the International Preliminary Report on Patentability (Chapter I) with a Notification from the International Bureau Form PCT/IB/338 International Application No. PCT/JP2016/055646 dated Oct. 5, 2017.

* cited by examiner

FIG. 5

| HF CONCENTRATION | PATTERN SHAPE | | |
|---|---|---|---|
| | RECTANGULAR | LINEAR | THINE LINE |
| 0ppm (COMPARATIVE EXAMPLE) | X | X | Δ1 |
| 100ppm | Δ1 | Δ1 | O |
| 1000ppm | Δ1 | O | Δ2 |
| 10000ppm | Δ2 | Δ2 | Δ2 |

⟨LEGEND⟩
X: RESIST REMAINS AND STRIPPING IS NOT ACHIEVED
Δ1: STRIPPING IS ACHIEVED PARTIALLY
Δ2: ALTHOUGH STRIPPING IS ACHIEVED, THERE IS DAMAGE TO THE SUBSTRATE SURFACE
O: RESIST IS STRIPPED AND THERE IS NO DAMAGE

⟨DATA IN COMMON⟩
SPM 2:1
90°C 1minute

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of PCT/JP2016/055646, filed Feb. 25, 2016, which claims priority to Japanese Patent Application Nos. 2015-061287 and 2015-246629, filed Mar. 24, 2015 and Dec. 17, 2015, respectively, the contents of all of which are incorporated herein by reference. The PCT International Application was published in the English language.

TECHNICAL FIELD

The present invention relates to a substrate processing apparatus and a substrate processing method which remove a resist from a front surface of a substrate. Substrates to be processed include, for example, semiconductor wafers, liquid crystal display device substrates, plasma display substrates, optical disk substrates, magnetic disk substrates, magneto-optical disk substrates, photomask substrates, ceramic substrates, and photovoltaic cell substrates.

BACKGROUND ART

It is known to supply a sulfuric acid/hydrogen peroxide mixture (SPM) to a front surface of a substrate to remove a resist from the front surface of the substrate.

When a high-dose ion implantation has been performed on a wafer, a hardened layer may format a surface of a resist due to hardening of a surface layer of the resist by carbonization and alteration of the resist.

Patent Document 1 proposes a method for removing a resist from a front surface of a substrate without performing asking even with a resist having a hardened layer at its surface. This document discloses a method for supplying high-temperature SPM to remove the resist, a surface layer of which has been hardened due to ion implantation, from the substrate.

PRIOR ART DOCUMENT

Patent Document

PATENT DOCUMENT 1: JP 2008-4878 A

SUMMARY OF THE INVENTION

Problem(s) to be Solved by the Invention

However, with the method of Patent Document 1, liquid droplets of the high-temperature SPM, which have been accelerated by nitrogen gas, collide against the substrate and therefore a device on a wafer may be damaged. Further, SPM is supplied in the form of liquid droplets and there are thus cases where it is difficult to secure a liquid amount sufficient to strip off the resist.

An object of the present invention is thus to provide a substrate processing method and a substrate processing apparatus, by which a resist can be removed satisfactorily from a front surface of a substrate.

Means for Solving the Problem

A preferred embodiment of the present invention provides a substrate processing method that removes a resist from a front surface of a substrate and includes a mixing step of mixing a hydrogen peroxide water and a hydrofluoric acid to produce a mixed solution of the hydrogen peroxide water and the hydrofluoric acid, a producing step of mixing the mixed solution of the hydrogen peroxide water and the hydrofluoric acid with a sulfuric acid after the mixing step to produce an HF-mixed SPM, which is a mixed solution of the sulfuric acid, the hydrogen peroxide water, and the hydrofluoric acid, and a supplying step of supplying the HF-mixed SPM to the front surface of the substrate.

Each of the hydrogen peroxide water and the hydrofluoric acid that are to be mixed in the mixing step may be of ordinary temperature.

The producing step may be a step of mixing the mixed solution of the hydrogen peroxide water and the hydrofluoric acid with the sulfuric acid at a position separated from the substrate.

The producing step may be a step of mixing the mixed solution of the hydrogen peroxide water and the hydrofluoric acid with the sulfuric acid at the front surface of the substrate.

According to these methods, the resist can be removed satisfactorily while suppressing damage to a device on a wafer.

Another preferred embodiment of the present invention provides a substrate processing apparatus that includes a substrate holding unit that holds a substrate including a front surface covered by a resist, and an SPM supplying unit that supplies an HF-mixed SPM, which is a mixed solution of a sulfuric acid, a hydrogen peroxide water, and a hydrofluoric acid, to the front surface of the substrate held by the substrate holding unit, and the SPM supplying unit includes a mixing unit that mixes the hydrogen peroxide water and the hydrofluoric acid to produce a mixed solution of the hydrogen peroxide water and the hydrofluoric acid, and an HF-mixed SPM production unit that mixes the mixed solution of the hydrogen peroxide water and the hydrofluoric acid with the sulfuric acid, after the mixing unit has mixed the hydrogen peroxide water and the hydrofluoric acid, to produce the HF-mixed SPM. According to this arrangement, the resist can be removed satisfactorily while suppressing damage to a device on a wafer.

The mixing unit may include a mixing tank to which the hydrogen peroxide water and the hydrofluoric acid are supplied individually and which stores the mixed solution of the hydrogen peroxide water and the hydrofluoric acid to be supplied to HF-mixed SPM production unit. According to this arrangement, the hydrogen peroxide water and the hydrofluoric acid can be mixed reliably before the mixed solution of the hydrogen peroxide water and the hydrofluoric acid is mixed with the sulfuric acid.

The mixing unit may further include a stirring unit that stirs the mixed solution inside the mixing tank. According to this arrangement, the hydrogen peroxide water and the hydrofluoric acid can be mixed uniformly. The stirring unit may be a rotor that rotates inside the mixed solution stored in the mixing tank or may be a bubbling unit that generates bubbles in the mixed solution stored in the mixing tank.

The stirring unit may include a bubbling unit that discharges a gas from a gas discharge port, disposed in the mixed solution stored in the mixing tank, to generate bubbles in the mixed solution. According to this arrangement, the hydrogen peroxide water and the hydrofluoric acid are mixed uniformly by the generation of bubbles.

The mixing unit may mix the hydrogen peroxide water with the hydrofluoric acid the amount of which is smaller than that of the hydrogen peroxide water. In this case, the HF-mixed SPM production unit may mix the sulfuric acid with the mixed solution the amount of which is smaller than that of the sulfuric acid. According to this arrangement, the HF-mixed SPM capable of stripping off the resist while suppressing damage to the substrate, that is, an HF-mixed SPM of low HF concentration can be produced.

The above and other objects, features, and effects of the present invention will become more apparent from the following detailed description of the preferred embodiments with reference to the attached drawings.

BRIEF DESCRIPTION OF THE DRAWINGS

FIG. 5 is a diagram showing conditions and results of a resist removing test.

DESCRIPTION OF PREFERRED EMBODIMENTS

Figure 1:
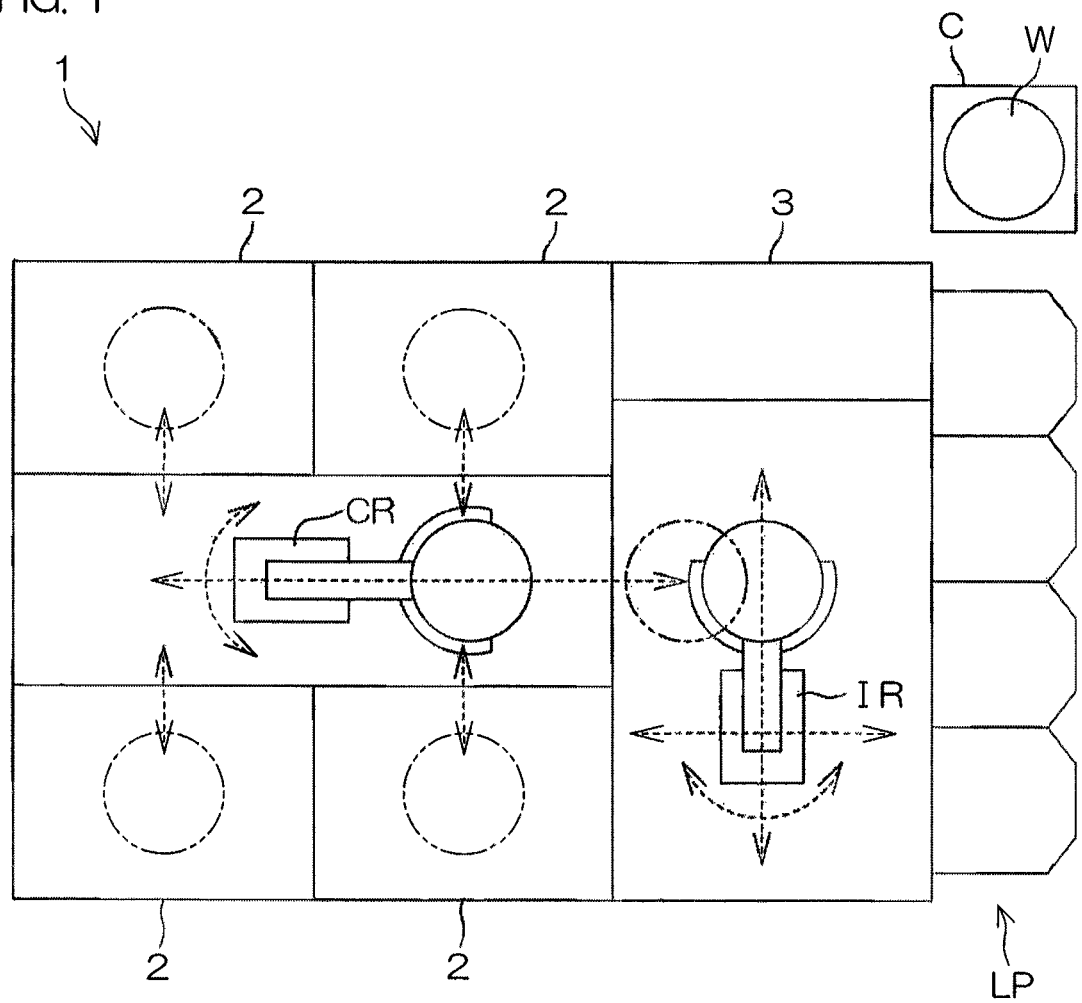
FIG. 1 a schematic plan view showing a substrate processing apparatus according to a preferred embodiment of the present invention.
Figure 2:
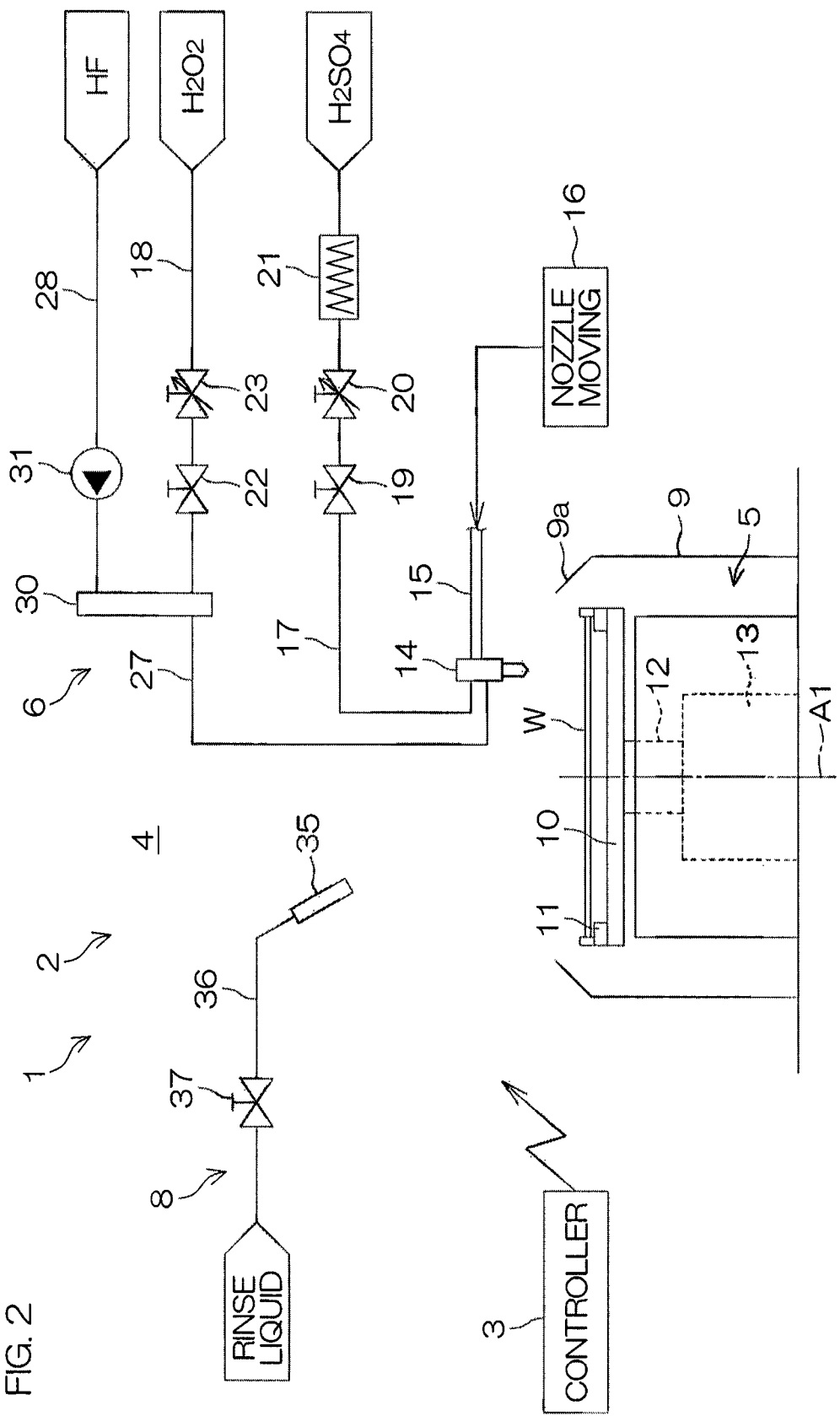
FIG. 2 a horizontal schematic view of the interior of a chamber included in the substrate processing apparatus shown in FIG. 1.

FIG. 1 is a schematic plan view showing a substrate processing apparatus 1 according to a preferred embodiment of the present invention. FIG. 2 is a horizontal schematic view of the interior of a chamber 4 included in the substrate processing apparatus 1 shown in FIG. 1.

As shown in FIG. 1, the substrate processing apparatus 1 is a single substrate processing type apparatus in which a disk-shaped substrate W, such as a semiconductor wafer, etc., is processed one by one. The substrate processing apparatus 1 includes a plurality of load ports LP that hold a plurality of carriers C which contain substrates W, a plurality of processing units 2 that process substrates W, conveyed from the plurality of load ports LP, with a processing liquid or a processing gas, transfer robots IR and CR that convey substrates W between the plurality of load ports LP and the plurality of processing units 2, and a controller 3, which controls the substrate processing apparatus 1.

As shown in FIG. 2, each processing unit 2 is a single substrate processing type unit. Each processing unit 2 includes the box-shaped chamber 4 that has an internal space, a spin chuck (substrate holding unit) 5, holding a single substrate W in a horizontal orientation inside the chamber 4 and rotating the substrate W around a vertical substrate rotation axis A1 passing through the center of the substrate W, an SPM supplying unit 6, supplying SPM, $H_2O_2$, and HF-mixed SPM (these shall hereinafter be referred to collectively as "SPM, etc.") to the substrate W held by the spin chuck 5, and a cylindrical cup 6, surrounding the spin chuck 5. The HF-mixed SPM means SPM to which HF has been added.

The spin chuck 5 includes a disk-shaped spin base 10 that is held in a horizontal orientation, a plurality of chuck pins 11 that hold the substrate W in a horizontal orientation above the spin base 10, a rotating shaft 12 that extends downward from the central portion of the spin base 10, and a spin motor 14 that rotates the substrate W and the spin base 10 around the rotation axis A1 by rotating the rotating shaft 12 The spin chuck 5 is not restricted to a clamping type chuck in which the plurality of chuck pins 11 are brought into contact with a peripheral end surface of the substrate W, and may be a vacuum type chuck in which a rear surface (lower surface) of the substrate W that is a non-device forming surface is suctioned onto an upper surface of the spin base 10 to hold the substrate horizontally.

The cup 9 is disposed on an outer side (in the direction away from the rotation axis A1) further than the substrate W held on the spin chuck 5. The cup 9 surrounds the spin base 10. Processing liquid, when supplied onto the substrate W with the spin chuck 5 rotating the substrate W, is diverted from the substrate W. When the processing liquid is supplied onto the substrate W, an upper end portion 9a of the cup 9 opened upward is disposed at a position higher than that of the spin base 10. Accordingly, the processing liquid, such as SPM and rinse liquid, diverted from the substrate W is received by the cup 9. The processing liquid received by the cup 9 is then sent to a collect apparatus or a waste liquid apparatus not shown.

The rinse liquid supplying unit 8 includes a rinse liquid nozzle 35 that discharges a rinse liquid toward the substrate W held by the spin chuck 5, a rinse liquid piping 36 that supplies the rinse liquid to the rinse liquid nozzle 35, and a rinse liquid valve 37 that switches between doing and stopping the supply of the rinse liquid from the rinse liquid piping 36 to the rinse liquid nozzle 35. The rinse liquid nozzle 35 is a fixed nozzle that discharges the rinse liquid with a discharge port of the rinse liquid nozzle 35 being kept still. The rinse liquid supplying unit 8 may include a rinse liquid nozzle moving unit that moves a landing position of the rinse liquid with respect to an upper surface of the substrate W by moving the rinse liquid nozzle 35.

When the rinse liquid valve 37 is opened, the rinse liquid supplied from the rinse liquid piping 36 to the rinse liquid nozzle 35 is discharged from the rinse liquid nozzle 35 toward an upper surface central portion of the substrate W. The rinse liquid is, for example, pure water (deionized water) of ordinary temperature (approx. 23° C.). The temperature of the pure water is not restricted to ordinary temperature and may be a temperature (for example, of 70 to 90° C.) that is higher than ordinary temperature. That is, the rinse liquid may be hot water (pure water of a temperature higher than ordinary temperature). Also, the rinse liquid is not restricted to pure water and may instead be any of carbonated water, electrolyzed ion water, hydrogen water, ozone water, and aqueous hydrochloric acid solution of dilute concentration (for example, approximately 10 to 100 ppm), etc.

The SPM supplying unit 6 includes an SPM nozzle 14, selectively discharging the SPM, etc., toward the upper surface of the substrate W, a first nozzle arm 15, having a tip portion on which the SPM nozzle 14 mounted, and a first nozzle moving unit 16 moving the SPM nozzle 14 by moving the first nozzle arm 15.

The SPM nozzle 14 is, for example, a straight nozzle that selectively discharges the SPM, etc., in a continuous flow state and is mounted on the first nozzle arm 15, for example, in a perpendicular orientation in which the SPM nozzle 14 discharges the processing liquid in a direction perpendicular to the upper surface of the substrate W. The first nozzle arm 15 extends in a horizontal direction and is arranged to be turnable around a first swinging axis (not shown) extending in a vertical direction at a periphery of the spin chuck 5.

The SPM nozzle 14 may instead be held by the first nozzle arm 15 in an inwardly directed orientation in which the SPM nozzle 14 discharges the SPM, etc., in a discharge direction that is inclined with respect to the upper surface of the substrate W so that the SPM, etc., lands at a position further inward (further toward the rotation axis A1 side) than the discharge port or be held by the first nozzle arm 15 in an outwardly directed orientation in which the SPM nozzle 14 discharges the SPM, etc., in a discharge direction that is inclined with respect to the upper surface of the substrate W so that the SPM, etc., lands at a position further outward (further toward the side opposite the rotation axis A1) than the discharge port.

The first nozzle moving unit 16 makes the first nozzle arm 15 turn around the first swinging axis to move the SPM nozzle 14 horizontally along a locus passing through the upper surface central portion of the substrate W in a plan view. The first nozzle moving unit 16 makes the SPM nozzle 14 move horizontally between processing positions, at each of which the SPM, etc., discharged from the SPM nozzle 14 lands on the upper surface of the substrate W, and a home position, at which the SPM nozzle 14 is positioned at the periphery of the spin chuck 5 in the plan view. The processing positions include a central position, at which the SPM, etc., discharged from the SPM nozzle 14 lands at the upper surface central portion of the substrate W, and a peripheral edge position, at which the SPM, etc., discharged from the SPM nozzle 14 lands at an upper surface peripheral edge portion of the substrate W.

The SPM supplying unit 6 further includes a sulfuric acid piping 17, connected to the SPM nozzle 14 and supplied with $H_2SO_4$ from a sulfuric acid supply source, and a mixed solution piping 27, connected to the SPM nozzle 14 and supplied with a hydrogen peroxide water or a mixed solution of the hydrogen peroxide water and the hydrofluoric acid. An upstream end of the mixed solution piping 27 is connected to a mixing portion 30 and a downstream end of the mixed solution piping 27 is connected to the SPM nozzle 14.

The mixing portion 30 is an example of a mixing unit that mixes the $H_2O_2$ and HF before mixing with $H_2SO_4$. The mixing portion 30 is connected to a hydrogen peroxide water piping 18, supplied with $H_2O_2$ from a hydrogen peroxide supply source, and a hydrofluoric acid piping 28, supplied with HF from a hydrofluoric acid supply source.

The $H_2SO_4$, supplied from the sulfuric acid supply source, the $H_2O_2$, supplied from the hydrogen peroxide water source, and the HF, supplied from the hydrofluoric acid supply source, are all aqueous solutions. The concentration of $H_2SO_4$ is, for example, 90 to 98%, the concentration of $H_2O_2$ is, for example, 30 to 50%, and the concentration of HF, is, for example, 47 to 51%.

In the sulfuric acid piping 17, a sulfuric acid valve 19, which opens and closes the sulfuric acid piping 17, a sulfuric acid flow rate regulating valve 20, which changes a flow rate of the $H_2SO_4$, and a heater 21, which heats the $H_2SO_4$, are interposed in that order from the SPM nozzle 14 side. Although not illustrated, the sulfuric acid flow rate regulating valve 20 includes a valve body, having a valve seat provided in its interior, a valve element, opening and closing the valve seat, and an actuator, which moves the valve element between an open position and a closed position. The same applies to other valves. The actuator of each valve is controlled by the controller 3.

The heater 21 maintains the $H_2SO_4$ at a temperature (a fixed temperature in a range of 70 to 100° C.; for example, 90° C.) that is higher than ordinary temperature. The heater 21 that heats the $H_2SO_4$ may be a single pass type heater as shown in FIG. 2 or may be a circulation type heater that heats the $H_2SO_4$ by making the $H_2SO_4$ circulate in a circulation path that includes the heater. The single pass type has an arrangement where the liquid to be heated passes by the heater just once, and the circulation type has an arrangement where the liquid to be heated passes by the heater a plurality of times.

In the hydrogen peroxide water piping 18, a hydrogen peroxide water valve 22, which opens and closes the hydrogen peroxide water piping 18, and a hydrogen peroxide water flow rate regulating valve 23, which changes a flow rate of the $H_2O_2$, are interposed in that order from the mixing portion 30 side. The $H_2O_2$ of ordinary temperature (approx. 23° C.) that is not temperature-controlled is supplied to the mixing portion 30 through the hydrogen peroxide water piping 18.

A micropump 31, which supplies the HF to the mixing portion 30, is interposed in the hydrofluoric acid piping 28. The micropump 31 has a function of feeding a liquid downstream and a function of interrupting the flow of the liquid. When the micropump 31 is driven, the HF of ordinary temperature (approx. 23° C.) that is not temperature-controlled is supplied to the mixing portion 30 through the hydrofluoric acid piping 28. The flow rate of the HF fed to the mixing portion 30 from the micropump 31 is controlled by the controller 3. The micropump 31 is an example of a hydrofluoric acid switching unit, switching between a supplying state, in which the HF is supplied to the mixing portion 30, and supply stopped state, in which the supplying of the HF to the mixing portion 30 is stopped. The hydrofluoric acid switching unit may be a hydrofluoric acid valve 32 (see FIG. 6) that opens and closes the hydrofluoric acid piping 28.

The mixing portion 30 is a member of substantially circular cylindrical shape and the $H_2O_2$ and HF are stirringly mixed in an interior of the mixing portion 30. The mixing portion 30 may be a mixing valve having the functions of the hydrogen peroxide water valve 22 and the hydrofluoric acid switching unit. In this case, the hydrogen peroxide solution valve 22 and the hydrofluoric acid switching unit may be omitted.

The flow rates of the $H_2O_2$ and HF flowing into the mixing portion 30 are controlled by the hydrogen peroxide solution flow rate regulating valve 23 and the micropump 31. When the flow rate of the $H_2O_2$ is 300 ml/min, the flow rate of the HF is, for example, 90 µl/min. Even when the flow rates differ from each other as in the present example, the $H_2O_2$ and HF are mixed uniformly by being stirred inside the mixing portion 30.

The SPM nozzle 14 has, for example, a casing with a substantially circular cylindrical shape. A mixing chamber is formed in an interior of the casing. The sulfuric acid piping 17 is connected to a sulfuric acid inlet disposed at a side wall of the casing of the SPM nozzle 14. The mixed solution piping 27 is connected to a mixed solution inlet disposed at the side wall of the casing of the SPM nozzle 14. The mixed solution inlet is disposed higher than the sulfuric acid inlet.

When the micropump 31 is driven in a state where the sulfuric acid valve 19 (see FIG. 2) and the hydrogen peroxide water valve 22 (see FIG. 2) are open, the $H_2SO_4$ from the sulfuric acid valve 17 is supplied to the mixing chamber from the sulfuric acid inlet of the SPM nozzle 14 and the $H_2O_2$ and HF from the mixed solution piping 27 are supplied to the mixing chamber from the mixed solution inlet of the SPM nozzle 14.

The $H_2SO_4$, $H_2O_2$, and HF that flow into the mixing chamber of the SPM nozzle 14 are stirringly mixed sufficiently in the mixing chamber. By the mixing, the $H_2SO_4$ and the $H_2O_2$ are mixed uniformly and a mixed solution (SPM) of the $H_2SO_4$ and the $H_2O_2$ is produced by a reaction of the $H_2SO_4$ and the $H_2O_2$. SPM that contains HF, that is, HF-mixed SPM is thereby produced.

The SPM contains peroxymonosulfuric acid ($H_2SO_5$), which has a high oxidizing power, and is heated to a temperature (of not less than 100° C., for example, 160° C.) higher than the temperatures of the $H_2SO_4$ and the $H_2O_2$ before mixing. The high-temperature HF-mixed SPM, produced in the mixing chamber of the SPM nozzle 14, is discharged from a discharge port opening at a tip (lower end) of the casing.

A sequence of producing the HF-mixed SPM shall now be considered.

If the SPM (mixed solution of $H_2SO_4$ and $H_2O_2$) is produced first and an extremely small amount of HF is mixed with the SPM thereafter, the HF will evaporate the instant it contacts the SPM of high temperature (of not less than 100° C.) The HF-mixed SPM, in which the HF is dispersed uniformly, will thus not be produced. However, by mixing the HF and $H_2O_2$ sufficiently in advance as described above, it becomes possible to produce the HF-mixed SPM, in which an extremely minute amount of the HF component is dispersed uniformly.

Figure 3:
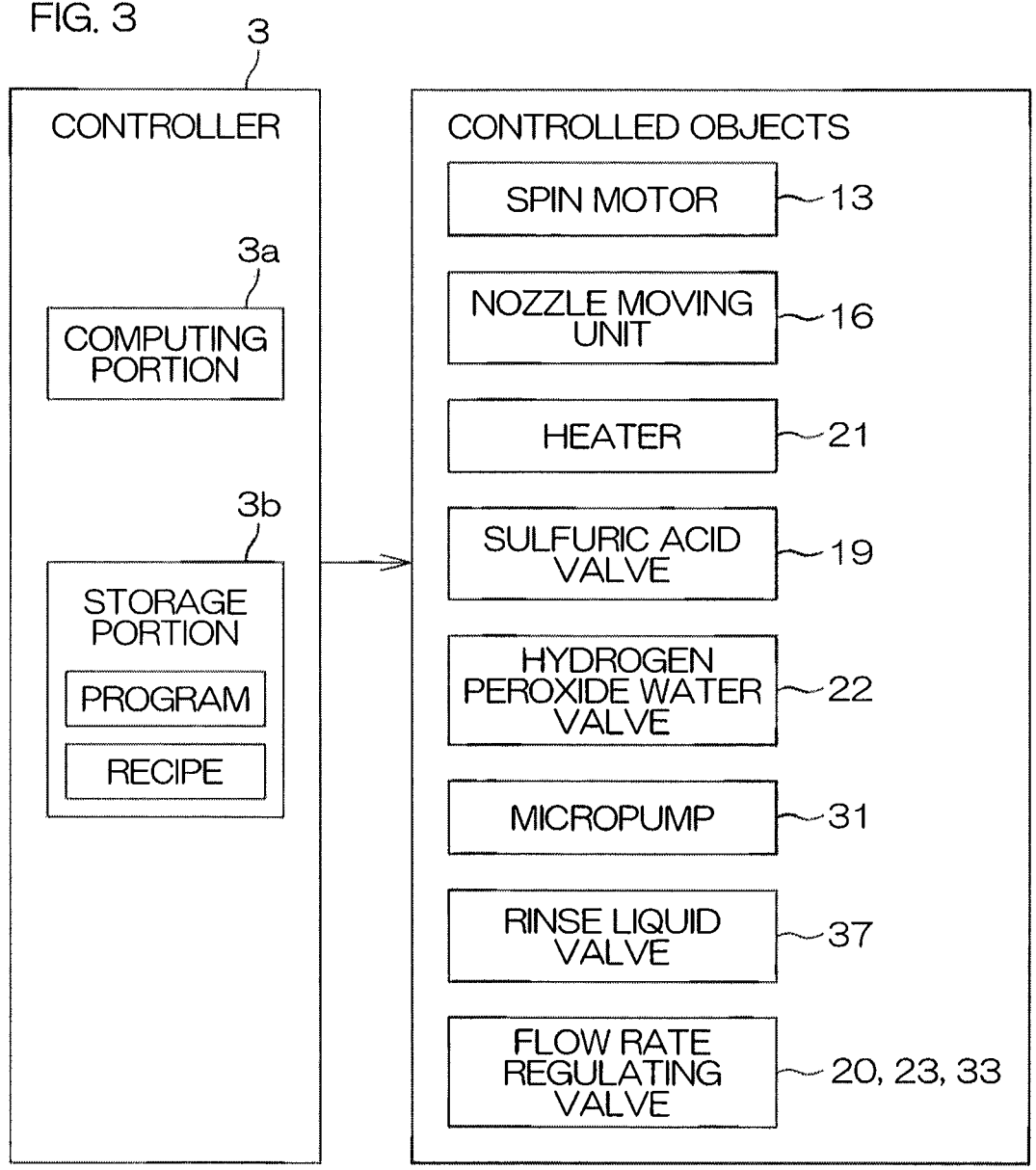
FIG. 3 is a block diagram showing a controller included in the substrate processing apparatus.
Figure 4:
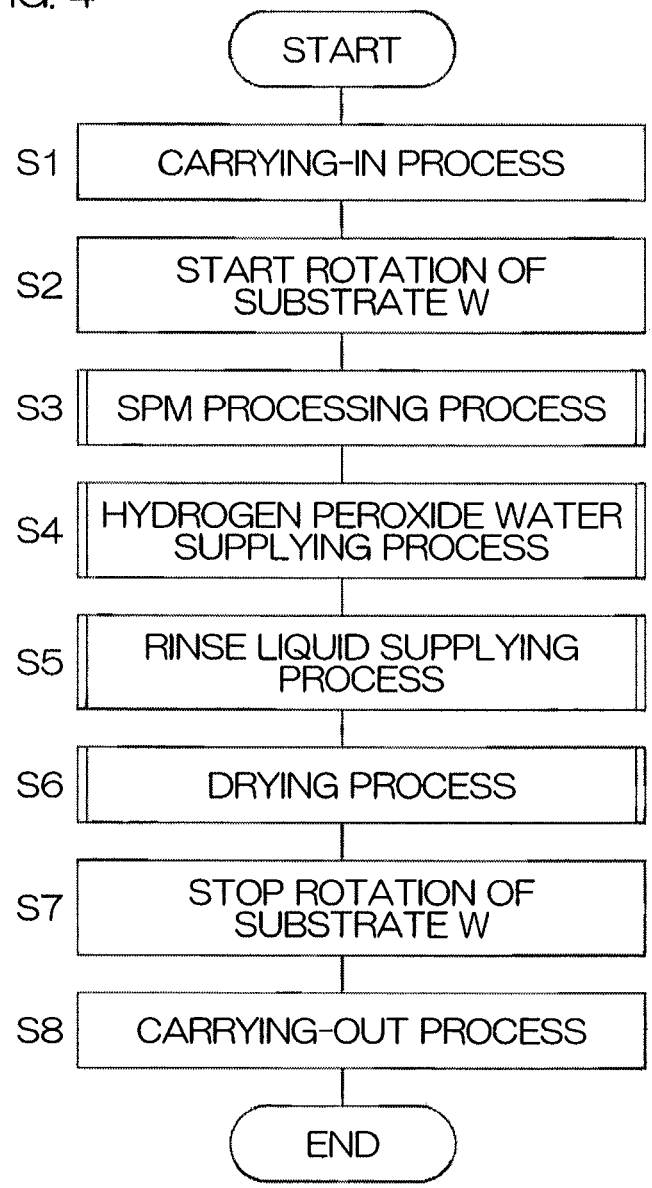
FIG. 4 is a flowchart showing an example of a resist removing process performed by a processing unit shown in FIG. 2.

FIG. 3 is a block diagram showing the controller 3. FIG. 4 is a flowchart showing an example of a resist removing process performed by the processing unit 2.

As shown in FIG. 3, the controller 3 is constituted of a microcomputer, etc., for example. The controller 3 controls the operations of the spin motor 13, the nozzle moving unit 16, the heater 21, etc., in accordance with a predetermined program. Also, the controller 3 controls the opening/closing of the sulfuric acid valve 19, the hydrogen peroxide water valve 22, the micropump 31, the rinse liquid valve 37, etc., and controls the actuators of the flow rate regulating valves 20, 23, and 33 to control the opening degrees of the corresponding flow rate regulating valves 20 and 23.

The controller 3 includes a storage portion 3b, storing information such as programs, and a computing portion 3a, controlling the substrate processing apparatus 1 in accordance with the information stored in the storage portion 3b. A recipe that indicates a processing procedure and processing processes of the substrate W is stored in the storage portion 3b. The controller 3 is programmed to control the substrate processing apparatus 1 based on the recipe stored in the storage portion 3b to make the substrate processing apparatus 1 execute the respective processes described below.

An example of a resist removing process shall now be described with reference to FIG. 2 and FIG. 4. The substrate W that is subject to the processing is a substrate on which an ion implantation process of high dose has been performed. The substrate W shall be one that has not been subject to processing for asking the resist.

When the resist removing process is performed on the substrate W by the processing unit 2, a carrying-in process of carrying the substrate W into the chamber 4 is performed (step S1). Specifically, in a state where all of the nozzles, etc., are retracted from above the spin chuck 5, the controller 3 makes the hand of the transfer robot CR (see FIG. 1), holding the substrate W, enter the interior of the chamber 4 to place the substrate W, with its front surface facing upward, above the spin chuck 5. Thereafter, the controller 3 starts the rotation of the substrate W by the spin motor 13 (step S2). The rotational speed of the substrate W is increased to a predetermined processing rotational speed (within a range of 100 to 500 rpm, for example, approx. 300 rpm) and is maintained at the processing rotational speed.

When the rotational speed of the substrate W reaches the processing rotational speed, the controller 3 then performs an SPM processing process (step S3) of supplying the SPM to the substrate W. Specifically, the controller 3 controls the first nozzle moving unit 16 to move the SPM nozzle 14 from the home position to a processing position. The SPM nozzle 14 is thereby positioned above the substrate W.

After the SPM nozzle 14 has been disposed above the substrate W, the controller 3 opens the sulfuric acid valve 19 and the hydrogen peroxide water valve 22 and further makes the micropump 31 be driven. The $H_2O_2$, flowing through the hydrogen peroxide water piping 18, and the HF, flowing through the hydrofluoric acid piping 28, are thereby made to flow into the mixing portion 30 and a mixed solution (HF-mixed $H_2O_2$) is thereby produced (mixing step). Further, the mixed solution, which has passed through the mixing portion 30, and the $H_2SO_4$, flowing through the interior of the sulfuric acid piping 17, are supplied to the SPM nozzle 14, and the $H_2SO_4$, $H_2O_2$, and HF become mixed in the mixing chamber of the SPM nozzle 14 to produce the HF-mixed SPM of high temperature (for example, of 160° C.) (producing step). The HF-mixed SPM is discharged from the discharge port of the SPM nozzle 14 and lands on the upper surface of the substrate W (supplying step). In this state, the controller 3 controls the first nozzle moving unit 16 to move a liquid landing position of the HF-mixed SPM with respect to the upper surface of the substrate W between the central portion and the peripheral edge portion.

The HF-mixed SPM discharged from the SPM nozzle 14 lands on the upper surface of the substrate W, which is rotating at the processing rotational speed (for example, of 300 rpm), and thereafter flows outward along the upper surface of the substrate W due to the centrifugal force. The HF-mixed SPM is thus supplied to the entire upper surface of the substrate W and an HF-mixed SPM liquid film covering the entire upper surface of the substrate W is formed on the substrate W.

It thereby becomes possible to effectively remove even a resist having a hardened layer at its surface. The hardened layer at the surface of the resist is organic matter that has carbon as a main component and has hardened due to ion implantation. The reason why the resist is removed effectively is considered to be because HF has an action of dissolving group 14 element oxides ($SiO_2$, etc.) and the HF, contained in the HF-mixed SPM, effectively removes the organic oxides on the surface of the resist.

It is also considered that the HF that permeates to a non-hardened layer of the resist slightly etches the Si and $SiO_2$ constituting the front surface of the substrate W at a boundary between the resist and the front surface of the substrate W and resist stripping performance is thereby improved.

Further, in the state where the substrate W is rotating, the controller 3 moves the liquid landing position of the HF-mixed SPM with respect to the upper surface of the substrate W between the central portion and the peripheral edge portion, so that the liquid landing position of the HF-mixed SPM passes through the entire upper surface of the substrate W and the entire upper surface of the substrate W is scanned.

The HF-mixed SPM discharged from the SPM nozzle 14 is thus supplied to the entire upper surface of the substrate W and the entire upper surface of the substrate W is processed uniformly.

When a predetermined HF-mixed SPM processing time elapses from the start of discharge of the HF-mixed SPM, the SPM processing process (step S3) ends. In continuation to the end of the SPM processing process (step S3), a hydrogen peroxide water supplying step (step S4) of supplying the $H_2O_2$ to the substrate W is performed.

Specifically, the controller 3 controls the first nozzle moving unit 16 to position the SPM nozzle 14 above the upper surface central portion of the substrate W and thereafter closes the sulfuric acid valve 19 while maintaining the hydrogen peroxide water valve 22 in the open state. At the same time, the controller 3 stops the micropump 31. Just the $H_2O_2$ is thereby supplied to the SPM nozzle 14 upon flowing through the interiors of the hydrogen peroxide water piping 18 and the mixed solution piping 27. The hydrogen peroxide water supplied to the SPM nozzle 14 flows through the interior of the SPM nozzle 14 and is discharged from the discharge port of the SPM nozzle 14. The $H_2O_2$ lands on the upper surface central portion of the substrate W rotating at the processing rotational speed. That is, the processing liquid discharged from the SPM nozzle 14 is switched from the HF-mixed SPM to the $H_2O_2$.

The $H_2O_2$ that has landed on the upper surface central portion of the substrate W flows outward along the substrate W toward the peripheral edge of the substrate W. The SPM on the substrate W is replaced by the $H_2O_2$ and eventually, the entire upper surface of the substrate W is covered by a liquid film of the $H_2O_2$.

When a predetermined hydrogen peroxide water supplying time elapses from the start of discharge of the hydrogen peroxide water, the controller 3 closes the hydrogen peroxide water valve 22 to stop the discharge of the $H_2O_2$ from the SPM nozzle 14. Also, the controller 3 controls the first nozzle moving unit 16 to move the SPM nozzle 14 from the processing position to the home position. The SPM nozzle 14 is thereby retracted from above the substrate W.

Next, a rinse liquid supplying step (step S5) of supplying the rinse liquid to the substrate W is performed. Specifically, the controller 3 opens the rinse liquid valve 37 to make the rinse liquid be discharged from the rinse liquid nozzle 35 toward the upper surface central portion of the substrate W. The rinse liquid discharged from the rinse liquid nozzle 35 lands on the upper surface central portion of the substrate W that is covered by the $H_2O_2$. The rinse liquid that has landed on the upper surface central portion of the substrate W flows outward along the substrate W toward the peripheral edge portion of the substrate W. The $H_2O_2$ on the substrate W is thereby forced to flow outward by the rinse liquid and is expelled to the periphery of the substrate W. The liquid film of $H_2O_2$ on the substrate W is thus replaced by the liquid film of rinse liquid that covers the entire upper surface of the substrate W. The $H_2O_2$ is thereby rinsed off across the entire upper surface of the substrate W. And when a rinse liquid supplying time elapses from the opening of the rinse liquid valve 37, the controller 3 closes the rinse liquid valve 37 to stop the discharge of the rinse liquid from the rinse liquid nozzle 35.

Next, a drying process (step S6) of drying the substrate W is performed. Specifically, the controller 3 controls the spin motor 13 to accelerate the substrate W to a drying rotational speed (for example, of several thousand rpm) and makes the substrate W rotate at the drying rotational speed. A large centrifugal force is thereby applied to the liquid on the substrate W and the liquid attached to the substrate W is shaken off to the periphery of the substrate W. The substrate W is thereby removed of liquid and the substrate W dries. When a prescribed time elapses from the start of high-speed rotation of the substrate W, the controller 3 controls the spin motor 13 to stop the rotation of the substrate W by the spin chuck 5 (step S7).

Next, a carrying-out process of carrying out the substrate W from inside the chamber 4 is performed (step S8). Specifically, in the state where all nozzles, etc., are retracted from above the spin chuck 5, the controller 3 makes the hand of the substrate transfer robot CR enter the interior of the chamber 4. The controller 3 then makes the hand of the transfer robot CR hold the substrate W on the spin chuck 5. Thereafter, the controller 3 makes the hand of the substrate transfer robot CR retract from inside the chamber 4. The processed substrate W is thereby carried out from the chamber 4.

Although in the processing example of FIG. 4, the hydrogen peroxide water supplying step (step S4) is executed after the SPM processing process, the hydrogen peroxide water supplying, step (step S4) may be omitted.

Also, although with the processing example of FIG. 4, a case where the substrate W is rotated at the SPM processing speed (for example, of approx. 300 rpm) in the SPM processing process (step S3) was described, the substrate W may be put in a puddle state in at least a portion of the period of the SPM processing process (step S3). The puddle state means a state where the upper surface of the substrate W is covered with a liquid film and the substrate is stationary in the rotation direction or is rotating at low rotational speed (of not more than 50 rpm). In the puddle state, the expelling of SPM from above the substrate W is suppressed and the liquid film of SPM is held on the upper surface of the substrate W. When the substrate W is in the puddle state, the supplying of SPM (discharging of SPM) to the substrate W may be stopped.

A resist removing test shall now be described.

FIG. 5 is a diagram showing conditions and results of the resist removing test. The resist removing test is for confirming the relationship between HF concentration in the SPM and resist removing performance.

Samples used in the present test are 300 mm diameter silicon wafers W on the entire front surface of which patterns of resist for a KrF (krypton fluoride) excimer laser are formed without gaps and As (arsenic) has been ion implanted into the front surface at a dosage of $1 \times 10^{16}$ atoms/cm$^2$ and a dose energy of 40 keV using this resist pattern as a mask.

Resist removing process of examples and that of a comparative example were performed using the substrate processing apparatus 1 on the present samples. Whether or not resist remained after the resist removing process and a degree of damage of portions besides the resist were observed using an electron microscope. A mixing ratio (flow rate ratio) of $H_2SO_4$ and $H_2O_2$ in the SPM used in the SPM processing process of step S3 was set to 2:1 and the processing time of the SPM processing process of step S3 was set to one minute. The HF concentration at this point was changed from 0 (comparative example) to 10000 ppm (Data 3). In a case where HF is added, the flow rate of $H_2O_2$ means the flow rate of the mixed solution of HF and $H_2O_2$.

EXAMPLES

The same processing was performed with HF-mixed SPMs differing in HF concentration. The HF concentrations of the HF-mixed SPMs used here are as follows.

Data 1 (100 ppm)
Data 2 (1000 ppm)
Data 3 (10000 ppm)

Comparative Example

The same processing as the examples was performed with SPM not containing HF.

The results of the present resist removing test are shown in FIG. 5. In FIG. 5, a case where there is no resist remaining and there is no damage to the substrate front surface is indicated by "○," a case where a small amount of resist remains is indicated by "Δ1," a case where stripping of the resist is achieved but there is damage to the substrate front surface is indicated by "Δ2," and a case where a large amount of resist remains or the resist is not stripped at all is indicated by "x."

As shown in FIG. 5, with the examples, the resist stripping performance improves in accordance with increase of the HF concentration. However, depending on the pattern shape, damage to the substrate surface, that is, etching of the substrate front surface was confirmed even in the case where the HF concentration is 1000 ppm. Also, with the HF concentration of 10000 ppm, damage to the substrate front surface was confirmed for all pattern shapes. On the other hand, with the comparative example, resist stripping was hardly observed for a silicon wafer W on which high-dose ion implantation was performed.

From the above, it can be understood that the resist stripping performance can be improved by mixing HF in SPM.

Although a preferred embodiment of the present invention has been described above, the present invention may be implemented in other modes.

Figure 6:
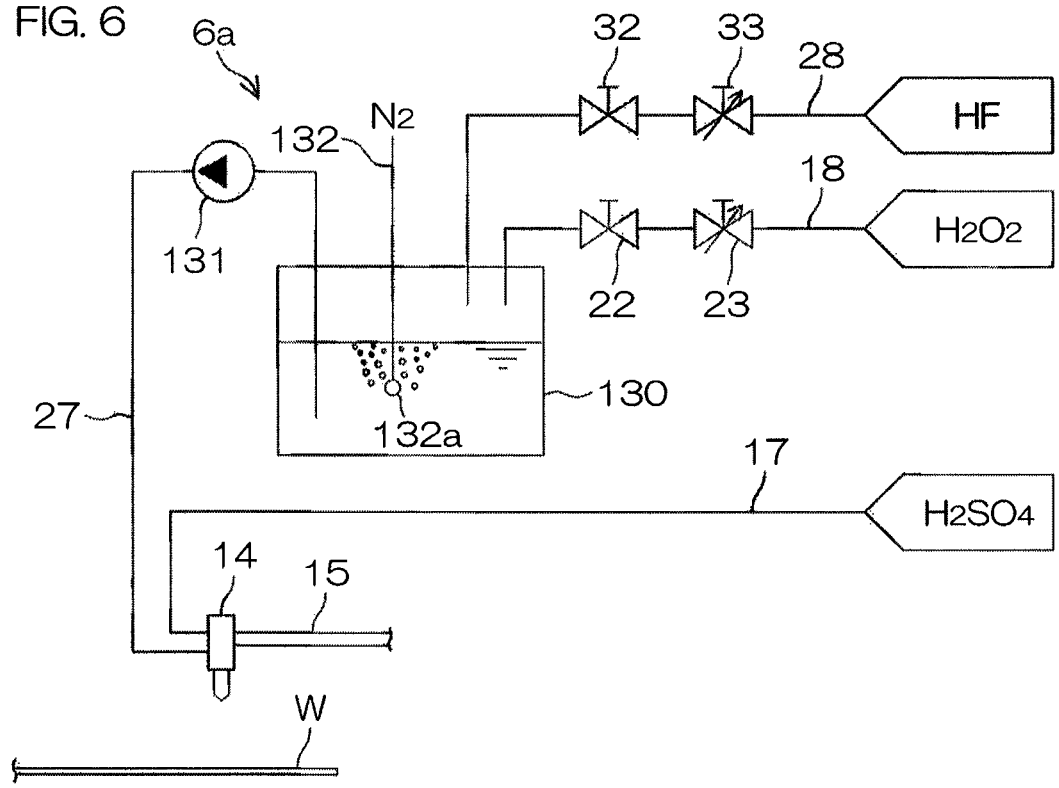
FIG. 6 is a diagram showing a portion of a substrate processing apparatus according to another preferred embodiment of the present invention.

Although in the preferred embodiment described above, the SPM supplying unit 6 included the mixed solution piping 27 that guides the mixed solution, mixed by the mixing portion 30, to the SPM nozzle 14, the present invention is not restricted to this arrangement. FIG. 6 is a diagram showing an SPM supplying unit 6a according to another preferred embodiment. In FIG. 6, equipment in common to that of FIG. 2 is provided with numbers in common and description thereof shall be omitted.

The mixed solution piping 27 of the SPM supplying unit 6a shown in FIG. 6 is connected to a mixing tank 130 instead of the mixing portion 30. A mixed solution pump 131 is interposed in the mixed solution piping 27. The hydrogen peroxide water piping 18, supplied with $H_2O_2$ from the hydrogen peroxide supply source, and the hydrofluoric acid piping 28, supplied with HF from the hydrofluoric acid supply source, are connected to the mixing tank 130.

In the hydrofluoric acid piping 28, the hydrofluoric acid valve 32, which opens and closes the hydrofluoric acid piping 28, and a hydrofluoric acid flow rate regulating valve 33, which changes a flow rate of the HF, are interposed in that order from the mixing tank 130 side. The HF of ordinary temperature (approx. 23° C.) that is not temperature-controlled is supplied to the mixing tank 130 through the hydrofluoric acid piping 28.

Prior to the SPM processing process (step S3), the controller executes a formulating process of formulating a mixed solution (HF-mixed $H_2O_2$) in the mixing tank 130. Specifically, the controller 3 opens the hydrogen peroxide water valve 22 to supply 30 L of $H_2O_2$ of a prescribed concentration to the mixing tank 130. Thereafter, the controller 3 opens the hydrofluoric acid valve 32 to supply 10 ml to 100 ml of HF of a prescribed concentration to the mixing tank 130. The supplying of the HF to the mixing tank 130 may be started before or after the start of supplying of the $H_2O_2$ or may be started at the same time as the supplying of the $H_2O_2$.

The $H_2O_2$ and HF are mixed inside the mixing tank 130. The SPM supplying unit 6a may further include a stirring unit that stirs the $H_2O_2$ and HF inside the mixing tank 130. The stirring unit is, for example, a bubbling unit 132, which discharges a gas, such as nitrogen gas, etc., from a gas discharge port 132a disposed inside the mixed solution inside the mixing tank 130 to generate bubbles in the mixed solution. When a stirring unit is provided, the $H_2O_2$ and HF inside the mixing tank 130 are mixed more uniformly.

The HF that is mixed with the $H_2O_2$ inside the mixing tank 130 may be of a lower concentration (for example, such that hydrogen fluoride:water=1:100, etc.) than ordinary. In this case, the amount of hydrogen fluoride contained in the HF-mixed $H_2O_2$ can be controlled with high precision.

The HF-mixed $H_2O_2$ produced in the mixing tank 130 is supplied to the SPM nozzle 14 by the mixed solution pump 131. Similarly, the $H_2SO_4$ is supplied to the SPM nozzle 14 from the sulfuric acid piping 17. The $H_2SO_4$, $H_2O_2$, and HF that flow into the mixing chamber of the SPM nozzle 14 are stirringly mixed sufficiently in the mixing chamber and the HF-mixed SPM is thereby produced. Thereafter, the HF-mixed SPM is discharged from the SPM nozzle 14 and supplied onto the substrate W. With the SPM supplying unit 6a according to the present preferred embodiment, it is possible to produce an $H_2O_2$/HF mixed solution of lower HF concentration than in the preferred embodiment described above. The reason is because the proportions of the $H_2O_2$ and HF can be changed more freely in comparison to a case where the $H_2O_2$ and HF are mixed inside a piping or a valve.

Figure 7:
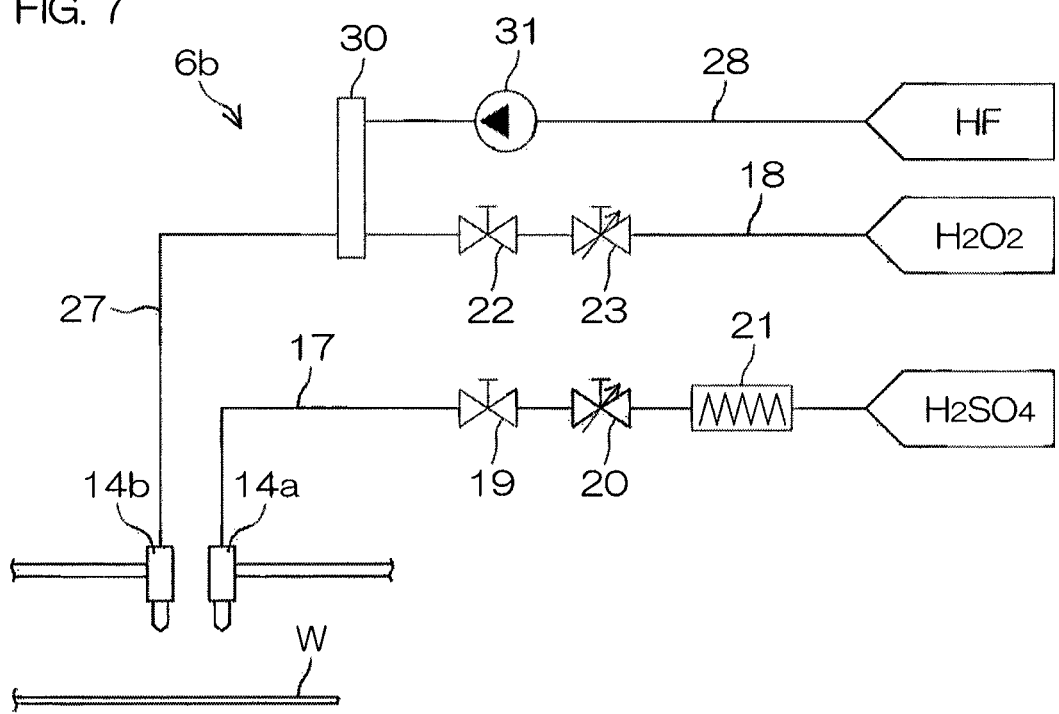
FIG. 7 is a diagram showing a portion of a substrate processing apparatus according to another preferred embodiment of the present invention.

Also, although with the above-described preferred embodiment and the other preferred embodiment, the $H_2SO_4$, $H_2O_2$, and HF are supplied to the single SPM nozzle 14, the present invention is not restricted to this arrangement. FIG. 7 is a diagram showing an SPM supplying unit 6b according to another preferred embodiment.

The SPM supplying unit 6b includes a sulfuric acid nozzle 14a and an $H_2O_2$/HF nozzle 14b. The sulfuric acid nozzle 14a discharges $H_2SO_4$ toward the substrate W. The $H_2O_2$/HF nozzle 14b discharges the $H_2O_2$/HF mixed solution, supplied from the mixing portion 30, toward the substrate W. The $H_2O_2$/HF nozzle 14b may discharge the $H_2O_2$/HF mixed solution, supplied from the mixing tank 130, toward the substrate W.

The sulfuric acid from the sulfuric acid nozzle 14a and the $H_2O_2$/HF mixed solution from the $H_2O_2$/HF nozzle 14b are supplied to the rotating substrate W and the $H_2SO_4$, $H_2O_2$, and HF are thereby stirringly mixed on the substrate W. The HF-mixed SPM is thereby produced. In other words, an HF-mixed SPM production unit that includes the sulfuric acid nozzle 14a and the $H_2O_2$/HF nozzle 14b produces the HF-mixed SPM on the substrate W. With the SPM supplying unit 6b according to the present preferred embodiment, the HF-mixed SPM is produced at a region closer to the substrate W in comparison to the preferred embodiments described above. The substrate W can thus be processed while maintaining a chemical activity of the SPM in a high state.

In each of the above described preferred embodiments, the case where the substrate processing apparatus 1 is an apparatus that processes a disk-shaped substrate is described, however, the substrate processing apparatus 1 may be an apparatus that processes a polygonal substrate such as a liquid crystal display device substrate.

The present application corresponds to Japanese Patent Application Nos. 2015-61287 and 2015-246629 respectively filed on Mar. 24, 2015 and Dec. 17, 2015 in the Japan Patent Office, and the entire disclosures of these applications are incorporated herein by reference.

While preferred embodiments of the present invention have been described in detail, it should be understood that these embodiments are merely illustrative of the technical principles of the present invention but not limitative of the invention. The spirit and scope of the present invention are to be limited only by the appended claims.

DESCRIPTION OF THE REFERENCE NUMERALS

1 Substrate processing apparatus
3 Controller
5 Spin chuck (substrate holding unit)
6 SPM supplying unit
14 SPM nozzle (HF-mixed SPM production unit)
14a Sulfuric acid nozzle (HF-mixed SPM production unit)
14b $H_2O_2$/HF nozzle (HF-mixed SPM production unit)
30 Mixing portion (mixing unit)
130 Mixing tank (mixing unit)
132 Bubbling unit (stirring unit)
132a Gas discharge port
W Substrate

What is claimed is:

1. A substrate processing method that removes a resist from a front surface of a substrate, the substrate processing method comprising:
    a first mixing step of mixing a hydrogen peroxide water and a hydrofluoric acid at a mixing unit to produce a first mixed solution containing the hydrogen peroxide water and the hydrofluoric acid;
    a second mixing step of mixing the first mixed solution containing the hydrogen peroxide water and the hydrofluoric acid with a sulfuric acid having a temperature of not less than 70° C. and not higher than 100° C. at a mixing chamber included in a nozzle that is connected to the mixing unit and disposed inside a chamber to produce a second mixed solution containing the sulfuric acid, the hydrogen peroxide water, and the hydrofluoric acid and having a temperature of not less than 100° C.; and
    a supplying step of causing the nozzle in the chamber to supply the second mixed solution, produced in the mixing chamber of the nozzle and having the temperature of not less than 100° C., to the front surface of the substrate in the chamber.

2. The substrate processing method according to claim 1, wherein each of the hydrogen peroxide water and the hydrofluoric acid that are mixed in the first mixing step is of room temperature.

3. The substrate processing method according to claim 1, wherein the second mixing step is a step of mixing the first mixed solution of the hydrogen peroxide water and the hydrofluoric acid with the sulfuric acid at the mixing chamber included in the nozzle when the nozzle is disposed above the substrate.

4. The substrate processing method according to claim 2, wherein the second mixing step is a step of mixing the first mixed solution of the hydrogen peroxide water and the hydrofluoric acid with the sulfuric acid at the mixing chamber included in the nozzle when the nozzle is disposed above the substrate.

5. The substrate processing method according to claim 1, wherein
    the first mixing step includes a step of mixing the hydrogen peroxide water and the hydrofluoric acid at the mixing unit to produce the first mixed solution of the hydrogen peroxide water and the hydrofluoric acid while controlling the concentration of the hydrofluoric acid in the first mixed solution.

6. The substrate processing method according to claim 1, wherein
    the supplying step includes a step of supplying the second mixed solution having a temperature of 160° C. to the front surface of the substrate.

7. The substrate processing method according to claim 1, wherein each of the hydrogen peroxide water and the hydrofluoric acid that are mixed in the first mixing step is at a temperature of approximately 23° C.

8. The substrate processing method according to claim 7, wherein the second mixing step is a step of mixing the first mixed solution of the hydrogen peroxide water and the hydrofluoric acid with the sulfuric acid at the mixing chamber included in the nozzle when the nozzle is disposed above the substrate.

9. The substrate processing method according to claim 1, wherein the second mixing step is a step of producing the second mixed solution in which the concentration of the hydrofluoric acid is a value in a range from 100 ppm to 1000 ppm.

10. The substrate processing method according to claim 1, further comprising a nozzle moving step of moving the nozzle within the chamber from a home position, at which the nozzle is positioned around the substrate in a plan view, to a processing position, at which the second mixed solution discharged from the nozzle lands on the front surface of the substrate, before the nozzle supplies the second mixed solution to the front surface of the substrate in the chamber.

* * * * *